(12) United States Patent
Ziolkowski et al.

(10) Patent No.: US 6,222,151 B1
(45) Date of Patent: Apr. 24, 2001

(54) LOW PROFILE WELDING FIXTURE

(75) Inventors: Peter W. Ziolkowski, Apalachin; Robert J. Lynch, Endicott, both of NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/188,276

(22) Filed: Nov. 9, 1998

(51) Int. Cl.[7] ............... B23K 11/093; B23K 11/36
(52) U.S. Cl. ............ 219/86.1; 219/158; 219/161; 228/44.3
(58) Field of Search ............... 219/158, 160, 219/161; 228/44.3, 44.7

(56) References Cited

U.S. PATENT DOCUMENTS

| | | | |
|---|---|---|---|
| 3,938,797 | * 2/1976 | Frederick | 219/161 |
| 4,050,618 | * 9/1977 | Angelucci et al. | |
| 4,283,847 | * 8/1981 | May . | |
| 4,538,956 | 9/1985 | Kalkbrenner et al. | 414/735 |
| 4,804,130 | 2/1989 | Kwan et al. | 228/6.2 |
| 4,902,868 | * 2/1990 | Slee et al. . | |
| 5,517,059 | 5/1996 | Eytcheson et al. | 257/699 |
| 5,632,437 | 5/1997 | Vongfuangfoo et al. | 228/177 |
| 5,716,493 | 2/1998 | Vongfuangfoo et al. | 156/579 |
| 5,866,867 | * 2/1999 | Gore . | |

* cited by examiner

Primary Examiner—Geoffrey S. Evans
(74) Attorney, Agent, or Firm—Jacobson & Johnson

(57) ABSTRACT

A fixture for holding two members in alignment and in pressure engagement with each other during partial welding of the two members to each other and for holding the members in alignment and pressure engagement with each other while the two members are repositioned in the welding machine so the welding of the members to each other can be completed. The fixture includes a magnetic base for positionably mounting the fixture with respect to a welding unit, an extension extending from the magnetic base with the extension angularly supporting a lever spring in a cantilevered fashion with the free end of the cantilevered spring engaging a ball held in position by a magnetic holder. The ball is positioned above the members so that pressure engagement of the ball with the free end of the cantilevered spring maintains the two members in alignment and pressure engagement to enable the hermetic sealing of the two members to each other or to permit angular repositioning of the two members with respect to a welding unit without having to disturb the alignment and contact between the two members.

10 Claims, 3 Drawing Sheets

LOW PROFILE WELDING FIXTURE

This invention was made with Government support under IWTA XK-34-00063 awarded by the U.S. Government. The Government has certain rights in this invention.

FIELD OF THE INVENTION

This invention relates generally to fixtures and more specifically, to a low profile welding fixture that can hold a cover on an integrated circuit housing while the cover and integrated circuit housing are hermetically sealed to each other with the welding fixture permitting the repositioning of the cover and integrated circuit housing with respect to a welding unit so that welds can be performed on different sides of the cover.

BACKGROUND OF THE INVENTION

One of the problems encountered in hermetically sealing covers for integrated circuits is that if the covers are not held in proper alignment during the welding operation, the cover may leak. If the cover leaks, the cover must be milled off and replaced, which can cause damage to the integrated circuit housing. One of the methods of holding the cover on the integrated circuit housing is to use hand pressure. Another is to form covers with a step that engages the housing. However, as there is usually limited space in the welding units and because the integrated circuit housing and cover must be rotated 90 degrees to complete the welding operation, the use of hand pressure has lead to unacceptable yields. In other cases, the use of covers with a separate engaging step is not suitable or efficient. The present invention provides a welding fixture that can hold the cover on the integrated circuit housing during a welding operation on one side of the cover and permits rotation of the cover and integrated circuit housing so that the adjacent sides of the cover can be welded to complete the hermetic sealing of the cover to the integrated circuit housing. In addition, through the use of a cantilevered lever spring, the cover and integrated circuit housing can be held in pressure engagement with each other even though there may be small clearance between the cover and the welding machine.

DESCRIPTION OF THE PRIOR ART

U.S. Pat. No. 5,716,493 discloses a spring biased clip which holds an integrated circuit on both sides during the hermetic sealing of the cover to the integrated circuit.

U.S. Pat. No. 5,517,059 discloses a device for electron beam attachment or laser welding of semiconductor subassemblies.

U.S. Pat. No. 5,632,437 discloses a method of centering a member for applying pressure to the center of the package.

U.S. Pat. No. 4,804,130 discloses a method and apparatus for sealing lids to chip carrier assembles to increase the efficiency and reliability.

U.S. Pat. No. 4,538,956 discloses an arm for griping, manipulating and releasing a workpiece.

SUMMARY OF THE INVENTION

A fixture for holding two members in alignment and also in pressure engagement with each other during partial welding of the two members to each other and for holding the members in alignment and pressure engagement with each other while the two members are repositioned in the welding machine so the welding of the members to each other can be completed. The fixture includes a magnetic base for mounting the fixture with respect to a welding unit, an extension extending from the magnetic base with the extension angularly supporting a lever spring in a cantilevered fashion with the free end of the cantilevered spring engaging a ball held in position by a magnetic holder. The ball is positioned above the members so that pressure engagement of the ball with the free end of the cantilevered spring maintains the two members in alignment and pressure engagement with each other to enable the hermetic sealing of the two members to each other or to permit angular repositioning of the two members with respect to a welding unit without having to disturb the alignment and contact between the two members.

DESCRIPTION OF THE PREFERRED EMBODIMENT

Figure 1:
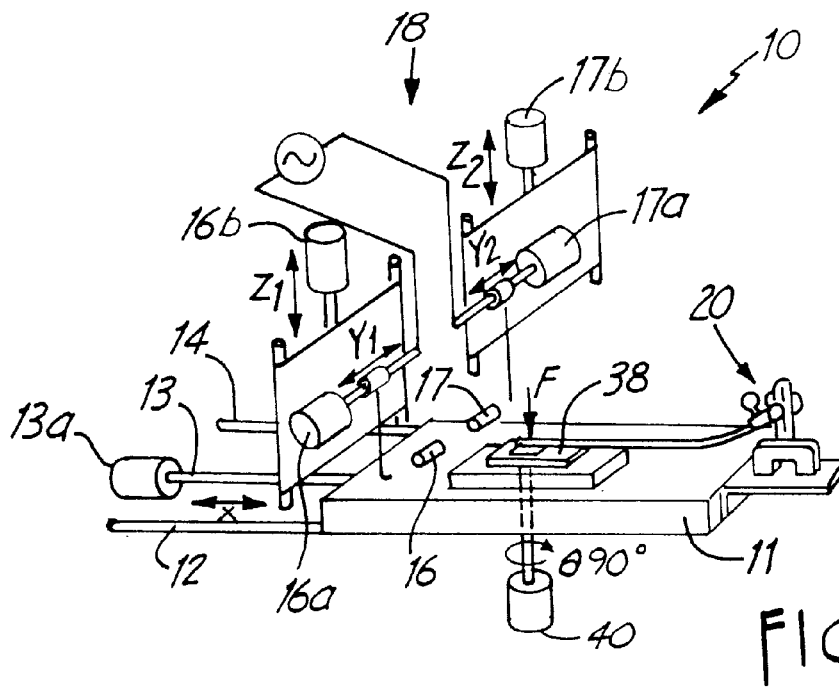
FIG. 1 is a perspective view of a welding system including a holding fixture for maintaining a cover and an integrated circuit housing in pressure contact during the repositioning or welding of the cover to the integrated circuit housing.

Referring to FIG. 1, reference numeral 10 identifies a welding system comprising a welding table 11 that is slideable longitudinally along support members 12, 13 and 14 with member 13 including a stop 13a to limit longitudinal movement of the welding table. Located above welding table 11 is a welding unit 15 having welding heads 16 and 17 that are postionable toward each other by cylinders 16a and 17a. Similarly, cylinders 16b and 17b permit the welding heads to be raised and lowered with respect to the welding table 11.

In operation of the present system, welding heads 16 and 17 are maintained in fixed position with respect to the welding table 11 while a cover 38 and an integrated circuit housing 30 are held in position by a holding fixture 20. Located below welding table 11 is an article rotator 40 for rotating cover 38 and integrated circuit housing 30 while they are located on welding table 11.

Figure 2:
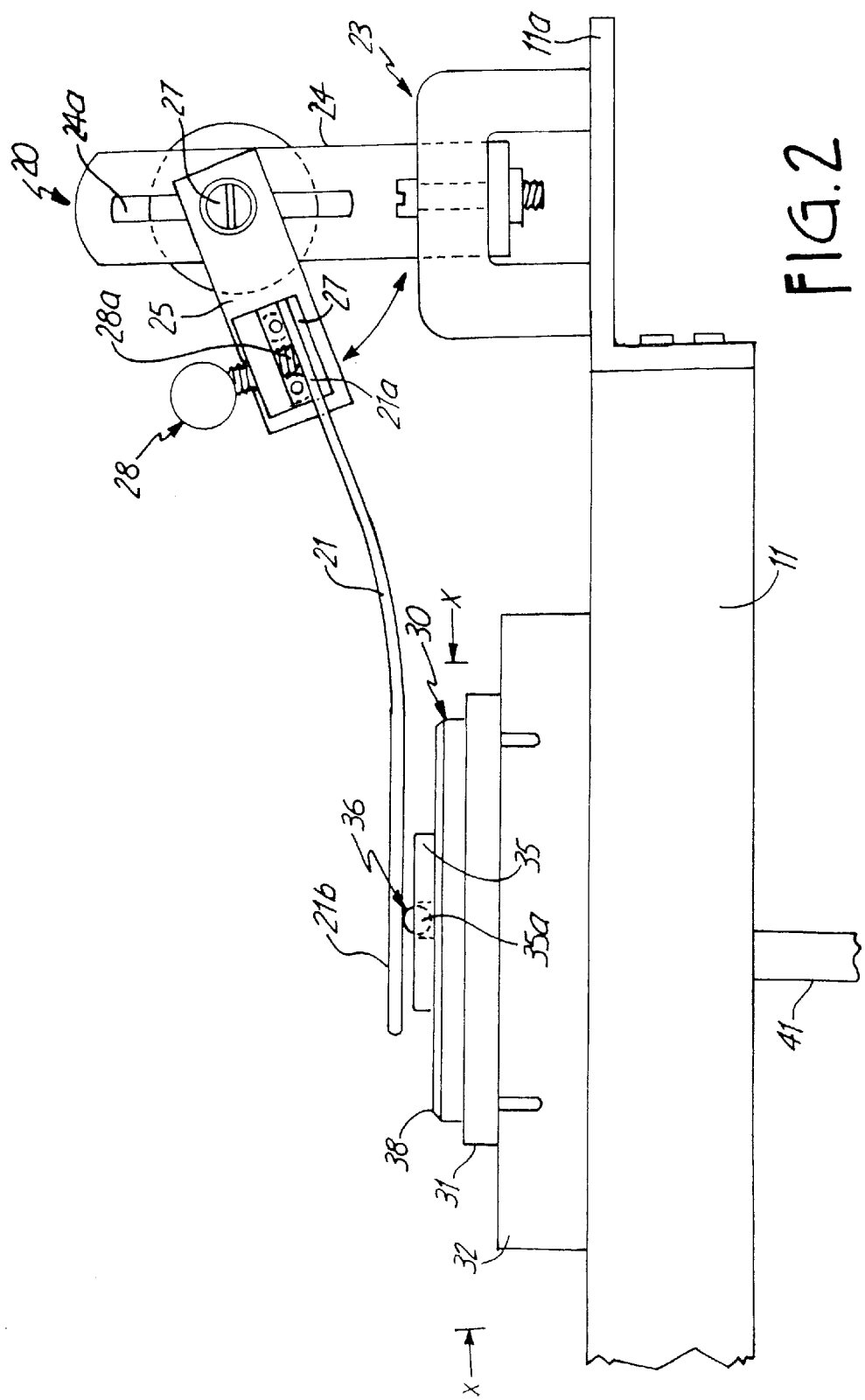
FIG. 2 is side view of the holding fixture securing a cover and integrated circuit housing to a welding table.

The holding fixture 20 is shown in side view in FIG. 2 and includes a lever spring 21 supported on end 21a in a cantilevered fashion with the free end 21b of lever spring 21 in pressure engagement with a metal ball 36. Metal ball 36 is held in position by a magnetic holder 35 comprising a magnet having a central opening 35a which has a diameter larger than the diameter of the metal ball. The use of magnetic holder 35 permits one to maintain metal ball within the central opening 35a of magnetic holder by the magnetic force of the magnetic holder. The magnetic holder has a dual purpose in that it frictionally holds the ball 36 in central opening 35a within magnetic holder 35 as the magnetic holder is attached to or detached from the cover 38. In addition, the magnetic holder 35 magnetically engages the cover 38 to thereby maintain the cover 38 in alignment and in contact with the magnetic holder 35.

The application of pressure to metal ball 36 by spring free end 21b transmits the force to cover 38 and integrated circuit housing 30 to hold the cover 38 in a welding condition on integral circuit housing 30 so the cover can be welded thereto by welding heads 16 and 17. It should be pointed out that it is important to maintain the cover and the integrated circuit housing in alignment and pressure contact so that when the welding is performed, usually with solder, the solder forms a good seal at the junction between the cover 38 and integrated circuit housing 30.

FIG. 2 shows that welding table 11 includes a block 32 that connects to shaft 41 which is rotatable by article rotator 40 (FIG. 1). Block 32 engages a support 31 with integrated circuit housing 30 resting thereon so that rotation of block 32 rotates support 31 and integrated circuit housing 30. In operation, the block 32 can be rotated about axis x on top of shaft 41 while pressure is maintained on cover 38 through the transmission of force from cantilever arm 21 through ball 36. Thus, a uniform amount of pressure continues to be transmitted to the cover even though the cover and integrated circuit housing are rotated to a different position.

The holding fixture 20 includes a U-shaped magnetic base 23 that is magnetically secured to bracket 11a which is attached to welding table 11. The use of a magnetic base permits lateral positioning of the holding fixture to accommodate the type of members being welded together. Attached to magnetic base 23 is a vertical extension 24 that includes an elongated slot 24a with a rotatable and postionable arm 25 connected thereto. Arm 25 is rotatably postionable on extension 24 through use of a fastener 27. Arm 25 includes a pressure clamp for securing lever spring generally to the holding fixture 20, and specifically to the arm 25. The pressure clamp includes a lower jaw 27 and a thumbscrew 28 having a lower end 28a that can engage end 21a therein by rotating thumbscrew 28. Lever spring 21 comprises a resilient elongated member that in normal use is maintained within the elastic limits of the material so that a constant pressure can be applied to metal ball 36. That is, lever spring 21 is shown in a partially bent condition to produce a restraining force on the free end of lever spring 21. One can adjust the amount of pressure on ball 36 by changing the angle of arm 25 with respect to extension 21 or by raising and lowering the arm 25 in vertical extension. In addition, the amount of pressure on metal ball 36 can be changed by changing the composition of the lever spring 21. That is, by using a lever spring with a greater spring constant, one can increase the pressure and by using lever spring with a lesser spring constant one can decrease the force on ball 36. Also, a shorter or longer lever spring could be used depending on the type of welding machine as the clearance between the welding machine and the workpiece is variable. In order to maintain the lever spring in pressure engagement, the magnetic base 23 should be sufficiently large so that the force on the lever spring is insufficient to cause the magnetic base 23 to release from the support bracket 11a.

Figure 3:
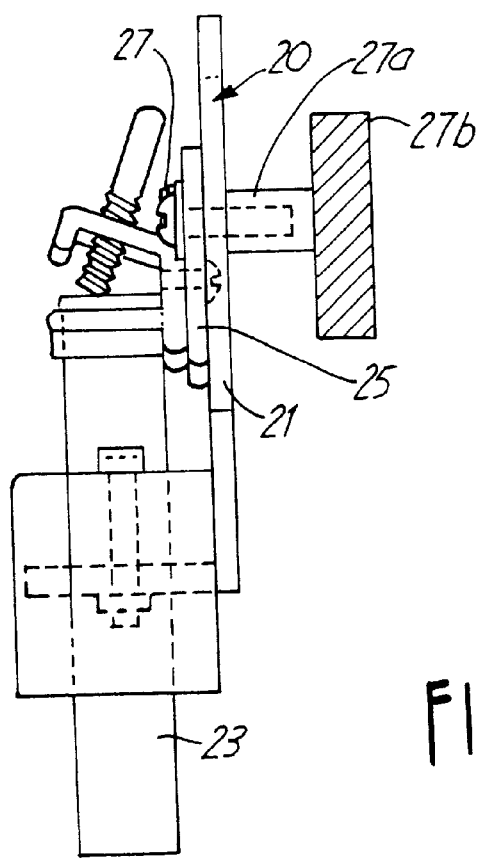
FIG. 3 is an end view of the holding fixture showing the arm locking member.

FIG. 3 is a side view of the fixture holder 20 showing the clamping member for holding arm 25 in a fixed position with respect to lever spring 21. Clamping member includes a threaded member 27 that has a head that engages arm 25 with the threaded member extending through lever spring 21 to engage a threaded shaft 27a that is rotatable by a knurled knob 27b. By loosing knob 27b one can permit arm 25 to be positioned with respect to lever spring 21, and by tightening knob 27b one can frictionally secure arm 25 to lever 21. Thus one can position the arm 25 at various angles allowing one to properly position the lever spring 21 with respect to the cover and integrated circuit housing.

Figure 4:
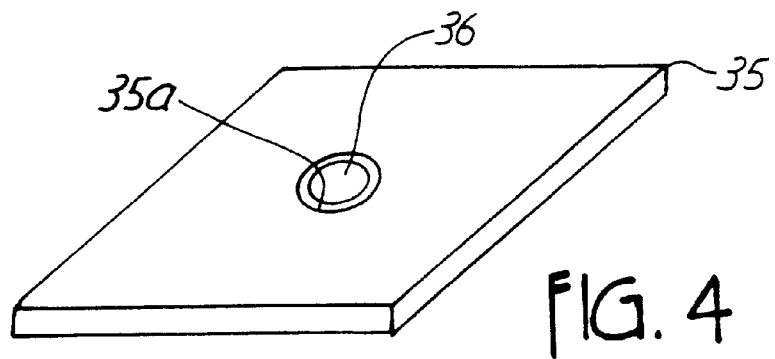
FIG. 4 is a perspective view of the magnetic holding member with a metal ball magnetically maintained therein.

FIG. 4 is a perspective view of the magnetic holding member 35 with a metal ball 36 magnetically maintained within central opening 35a by the magnetic field of magnetic holding member 35.

Figure 5:
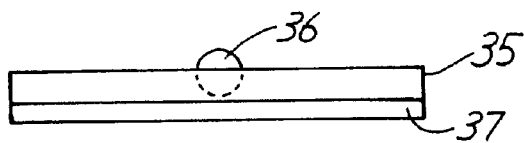
FIG. 5 is an end view alternate embodiment of the magnetic holding member.

FIG. 5 is an end view of an alternate embodiment of the magnetic holding member 35 with a rigid member 37 that can be used if one wants to distribute the force over a wider area of the cover 38.

In operation of the present invention, one places the cover 38 and integrated circuit housing 30 on a support 31 that is fastened to a support block 32 which is located on a movable welding table. The cover can include solder, brazing material or the like thereon so that only heating is required to melt the material to produce a hermetic seal between cover 38 and the integrated circuit housing 30. As the cover and integrated circuit housing are usually square or rectangular, the two opposed sides are welded by moving the slideable table with the cover 38 and integrated circuit housing 30 between welding heads 16 and 17. In order to hold the cover 38 and integrated circuit housing 30 in position, the base member 23 is magnetically positioned on table 11 or a bracket. Next, the magnetic holder 35 is positioned on cover 38 with the metal ball protruding therefrom. The lever spring 21 is then positioned so that the free end 21b is in pressure engagement with metal ball 36 to exert sufficient pressure to hold the cover 38 in an aligned and pressured engagement with the integrated circuit housing 30. The amount of pressure can be determined by the size of the cover 38 and the integrated circuit housing 30, with a larger cover requiring more force to be kept in position than a smaller cover. Once the cover 38 is held in an aligned and pressured engagement with integrated circuit housing 30, the welding heads 16 and 17 are positioned and the movable table 11 is moved between the welding heads 16 and 17 to weld the opposed sides of the cover 38 to the integrated circuit housing 30. After completion of the welding of the two sides, the rotator rotates block 32 ninety degrees while the pressure from cantilevered arm 21 is being maintained through ball 36 on cover 38. After rotation of block 32, the two remaining unwelded sides of the cover 38 and integrated circuit housing 30 are welded together by again moving the welding table between the welding heads 16 and 17. Thus, it can be appreciated that with the present invention, the welding of opposite sides of a cover can be accomplished without having to remove the holding force on the cover. Consequently, by maintaining a substantially uniform force on the cover 38 during the welding operation, one minimizes the chances for misalignment that could produce a defective seal.

Figure 6:
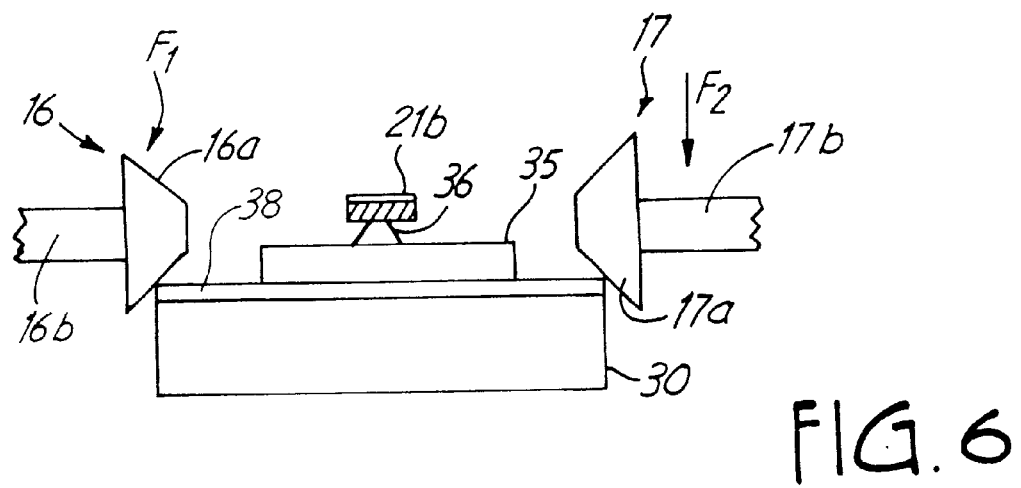
FIG. 6 is an end view of the welding heads in operation.

FIG. 6 shows in greater detail welding units 16 and 17 in the process of welding cover 38 to integrated circuit housing 30. Welding unit 16 comprises a frusto-conically shaped head 16a that is rotatably supported by shaft 16b. Similarly, welding unit 17 comprises a frusto-conically shaped welding head 17a that is rotatably supported by shaft 17b. Cover 38 is held in pressure contact with integrated circuit housing 30 by the lever spring and the forces $F_1$ and $F_2$. With welding heads 16a and 17a in engagement with cover 38, current can be transmitted therethrough to weld cover 38 to integrated circuit housing 30. In the embodiment shown, a fusible material such as brazing alloy is applied to the underside of the cover 38 before the cover 38 is positioned on the integrated circuit housing 30.

We claim:

1. A welding fixture comprising:
   a lever spring having a first end and a second end;
   a first member, said first member having a magnetic base
       for magnetically securing said magnetic base in a fixed position, said first member including an extension, said extension engaging the first end of said lever spring for preventing movement of said first end of said lever spring;

a metal ball; and a magnetic holder, said magnetic holder having a central opening therein with said metal ball maintainable within the magnetic holder by the magnetic force of the magnetic holder to thereby enable the magnetic holder and the metal ball to be handled as a single unit so that the magnetic holder and metal ball can be placed on a cover located on a base member with the second end of the lever spring in pressure engagement with the metal ball to thereby hold the cover on the base member even though the cover and base member are rotated with respect to said lever spring.

2. The welding fixture of claim 1 wherein the metal ball has a diameter greater than a thickness of the magnetic holder so that the metal ball protrudes from said magnetic holder when the magnetic holder is located in magnetic engagement with said cover.

3. The welding fixture of claim 1 wherein said extension includes a clamp for engaging the first end of said lever spring.

4. The welding fixture of claim 3 wherein the clamp is rotationally postionable with respect to said extension.

5. The welding fixture of claim 4 wherein the clamp includes a thumbscrew.

6. A welding system comprising:

a welding table;

a welding unit, said welding unit movable along said welding table;

an article rotator for rotating articles located on said welding table;

a lever spring, said lever spring cantilevered supported with the free end of said lever spring in pressure engagement with an article to be welded to another article to thereby hold the articles in position with respect to each other while the articles are welded to each other by the welding unit or rotated with respect to the welding unit by the article rotator.

7. The welding system of claim 6 including a block for supporting one of the articles to be welded with the block connected to the article rotator to permit rotation of the one of the articles while the one of the articles is on the welding table.

8. The welding system of claim 6 including magnetic base member for magnetically securing the lever spring in position.

9. The welding system of claim 6 including a magnetic holding member having a member therein for contact engagement with the free end of the spring.

10. The welding system of claim 6 including a thumbscrew for securing the lever spring in a holding position.

* * * * *